(12) United States Patent
Kageura

(10) Patent No.: US 8,345,987 B2
(45) Date of Patent: Jan. 1, 2013

(54) METHOD AND PROGRAM FOR CREATING ANALYSIS MODEL

(75) Inventor: Masaru Kageura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1202 days.

(21) Appl. No.: 12/143,316

(22) Filed: Jun. 20, 2008

(65) Prior Publication Data

US 2009/0060347 A1 Mar. 5, 2009

(30) Foreign Application Priority Data

Jun. 22, 2007 (JP) ................. 2007-165524

(51) Int. Cl.
*G06K 9/46* (2006.01)

(52) U.S. Cl. ....................................... 382/203

(58) Field of Classification Search ......... None
See application file for complete search history.

(56) References Cited

U.S. PATENT DOCUMENTS

2005/0197822 A1* 9/2005 Onodera et al. ............... 703/22
2008/0027968 A1* 1/2008 Kfouri et al. .................. 707/102

FOREIGN PATENT DOCUMENTS

| JP | 2003-337836 A | 11/2003 |
| JP | 2003337836 A | * 11/2003 |
| JP | 2005-250647 A | 9/2005 |

* cited by examiner

*Primary Examiner* — Vikkram Bali
*Assistant Examiner* — Fred Hu
(74) *Attorney, Agent, or Firm* — Canon USA, Inc., IP Division

(57) ABSTRACT

A method of creating an analysis model includes the steps of storing first shape information in association with instruction information that is used for creating the analysis model and that includes shape feature information about a connecting part in the first shape information; comparing second shape information with the first shape information associated with the instruction information; determining whether a difference between the first shape information and the second shape information is within an allowable range for the shape feature information included in the instruction information; and setting the instruction information if the difference between the first shape information and the second shape information is within the allowable range.

15 Claims, 11 Drawing Sheets

FIG. 4
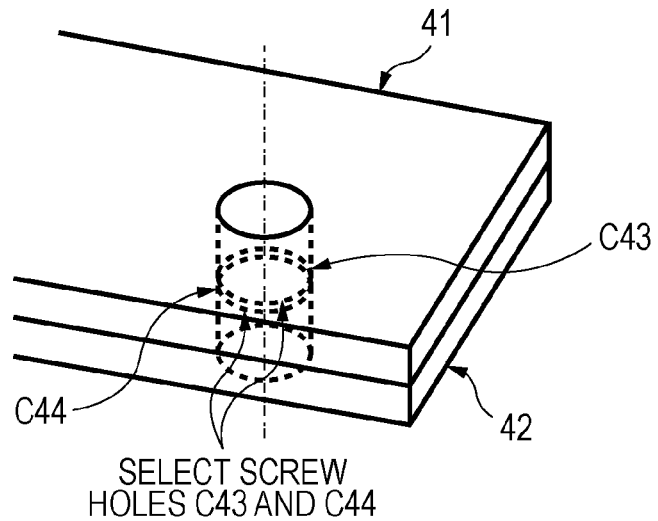
SELECT SCREW
HOLES C43 AND C44
FIG. 5
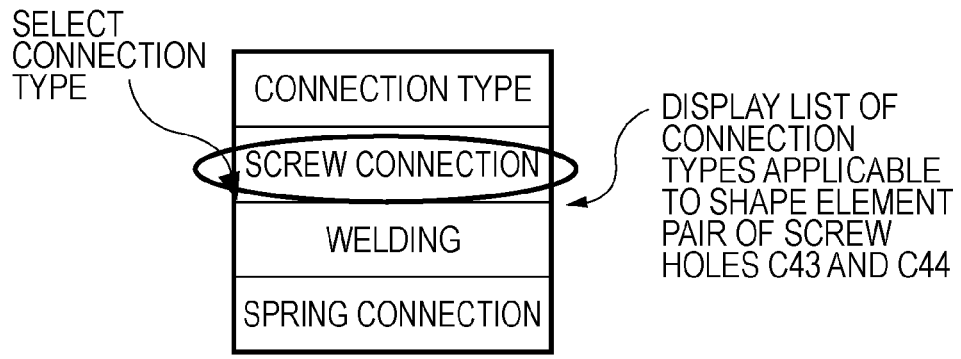
FIG. 6
| | CONNECTION TYPE | ELEMENT ID 1 | ELEMENT ID 2 |
|---|---|---|---|
| 1 | WELDING | C1 | C2 |
| 2 | SCREW CONNECTION | C43 | C44 |
ADDED CONNECTION SETTINGS

| ELEMENT ID | CENTRAL COORDINATE | RADIUS | NORMAL VECTOR | LOWER LEFT POINT OF INCLUDING RECTANGULAR PARALLELEPIPED | UPPER RIGHT POINT OF INCLUDING RECTANGULAR PARALLELEPIPED |
|---|---|---|---|---|---|
| C73 | 1234 | (cx1,cy1,cz1) | r1 | (nx1,ny1,nz1) | (lx1,ly1,lz1) | (ux1,uy1,uz1) |
| C74 | 5678 | (cx2,cy2,cz2) | r2 | (nx2,ny2,nz2) | (lx2,ly2,lz2) | (ux2,uy2,uz2) |

| | CONNECTION TYPE | ELEMENT ID 1 | ELEMENT ID 2 |
|---|---|---|---|
| 1 | WELDING | C1 | C2 |
| 2 | SCREW CONNECTION | C103 | C104 |

BEFORE SHAPE CHANGE

FIG. 14

AFTER SHAPE CHANGE

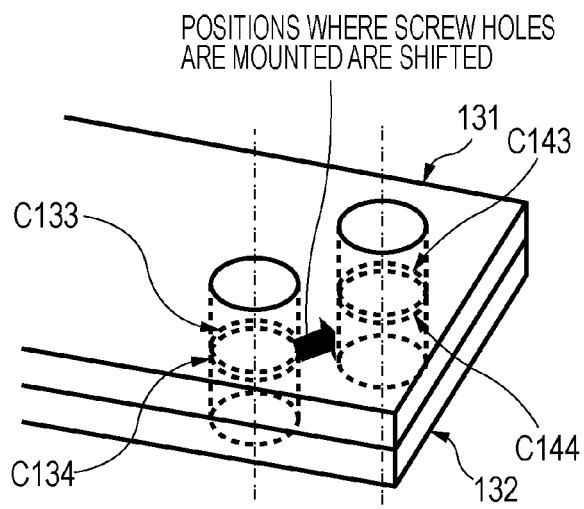

FIG. 15

| | ELEMENT ID | CENTRAL COORDINATE | RADIUS | NORMAL VECTOR | LOWER LEFT POINT OF INCLUDING RECTANGULAR PARALLELEPIPED | UPPER RIGHT POINT OF INCLUDING RECTANGULAR PARALLELEPIPED |
|---|---|---|---|---|---|---|
| C133 | 1234 | (cx1,cy1,cz1) | r1 | (nx1,ny1,nz1) | (lx1,ly1,lz1) | (ux1,uy1,uz1) |
| C134 | 5678 | (cx2,cy2,cz2) | r2 | (nx2,ny2,nz2) | (lx2,ly2,lz2) | (ux2,uy2,uz2) |

FIG. 16

| | ELEMENT ID | CENTRAL COORDINATE | RADIUS | NORMAL VECTOR | LOWER LEFT POINT OF INCLUDING RECTANGULAR PARALLELEPIPED | UPPER RIGHT POINT OF INCLUDING RECTANGULAR PARALLELEPIPED |
|---|---|---|---|---|---|---|
| C143 | 1234 | (cx1',cy1',cz1') | r1' | (nx1',ny1',nz1') | (lx1',ly1',lz1') | (ux1',uy1',uz1') |
| C144 | 5678 | (cx2',cy2',cz2') | r2' | (nx2',ny2',nz2') | (lx2',ly2',lz2') | (ux2',uy2',uz2') |

BEFORE SHAPE CHANGE

SCREW CONNECTION IS APPLICABLE

SCREW CONNECTION IS INAPPLICABLE

METHOD AND PROGRAM FOR CREATING ANALYSIS MODEL

BACKGROUND OF THE INVENTION

1. Field of the Invention

The present invention relates to a method of creating an analysis model and to a program for creating an analysis model.

2. Description of the Related Art

Design works involve numerical analysis simulation of designed products and review of the design content on the basis of the analysis results. In such an analysis, the numerical analysis simulation is performed to several patterns resulting from modification of a basic shape to confirm the analysis results of each pattern.

For example, strength analysis or vibration analysis of an assembly will now be considered. FIG. 20 is a schematic perspective view illustrating an exemplary assembly designed by a designer. The assembly in FIG. 20 has a structure in which a part 200 having a mounting hole 201 is joined to a part 202 having a mounting hole 203 via the mounting holes with a connecting part (not shown), such as a screw. The designer performs desired analysis to the assembly with the mounting holes 201 and 203 bored in the tabular parts 200 and 202, respectively.

FIG. 21 is another schematic perspective view of the assembly shown in FIG. 20, in which a rib 216 is provided on the surface of the part 200. The rib 216 does not concern the connection between the part 200 and the part 202. The assembly in FIG. 21 results from design change in which the mounting holes 201 and 203 are shifted in a direction denoted by an arrow 212 to mounting holes 214 and 215, respectively. The designer performs the analysis again after the design change to confirm a change in the stress state or vibration state caused by the shift of the holes in which the screw is mounted and the addition of the rib 216.

Methods in related art are proposed to create an analysis model from a shape model of an assembly. In a first method, an apparatus searches the shape model of the assembly for the shape features of connecting parts. Then, an operator selects a candidate for the connection type of each shape feature that has been searched for. The apparatus automatically creates a finite element model (FEM) of the connecting part of the selected connection type on the basis of a creating process stored in a database (for example, refer to Japanese Patent Laid-Open No. 2003-337836).

In a second method, after mesh data about each part is generated in advance and layout of the parts is performed, an analysis model is newly added to each joint part between the parts to automatically recreate the analysis models of the parts that are shifted to other positions (for example, refer to Japanese Patent Laid-Open No. 2005-250647).

However, the method of creating an analysis model and the apparatus of creating an analysis model in the related art have the following problems. When the assembly in FIG. 20 is subjected to the design change to provide the assembly in FIG. 21, it is necessary to create the analysis model for each designed assembly to perform the analysis. During the development and analysis, the shapes of products are frequently changed not only to perform the strength or vibration analysis but also to meet restrictions on other parts. Accordingly, the analysis models are recreated and reviewed in response to the shape change.

It takes a very long time to create an analysis model from the shape model of an assembly produced by a computer aided design (CAD) system in the related art. In particular, much effort is expended to model the connecting parts between the parts. In addition, if even part of the shape model is modified, it is necessary to recreate an analysis model from the first on the basis of the modified shape model or to modify the created analysis model so as to support the change in the shape model.

The former operation means full recreation of the analysis models and much effort is expended because the analysis model before the modification is discarded and a new analysis model is recreated from the first. In the latter operation, the shape of the mesh of the created analysis model is directly edited. However, it is not easy and much effort is expended to edit the analysis model. Accordingly, the use of the previous analysis model does not have a big advantage.

A technology called morphing is adopted to effectively use an analysis model that is created. In the morphing, the mesh is modified while keeping the relationship between adjacent parts. However, it is difficult to precisely control the mesh shape of certain parts, such as the connecting parts, and certain functional parts and editing of the mesh by an engineer is essential to coincidence between the analysis results and the actual phenomena.

Specifically, with the first method, it is difficult to automatically search the shape model for the shape features of connecting parts and create the analysis models of the connecting parts from the shape model. Accordingly, it takes a very long time for an operator to search for and select the shape features and to select and instruct a process of creating an analysis model. Also if part of the shape is modified, it takes a very long time because it is necessary for the operator to perform the above operations again.

With the second method, it is necessary to rebuild the mesh shape of each part around a connecting part in accordance with the arrangement of the parts even if the mesh shape of each part composing an assembly is set in advance. In this process, it is difficult to automate recognition of the connecting part in accordance with the arrangement of the parts, selection of an appropriate process of creating an analysis model of the connecting part, and matching between the set mesh shape of each part and the rebuilt mesh shape of each part around the connecting part. Accordingly, when the arrangement of the parts is changed, it takes a very long time because it is necessary for an operator to perform the above operations.

SUMMARY OF THE INVENTION

The present invention provides a method of creating an analysis model and a program for creating an analysis model, which are capable of greatly reducing the time necessary to create the analysis model for a shape model part of which is modified.

The present invention provides a method of creating an analysis model and a program for creating an analysis model, which are capable of automatically extracting only parts that are required to be reset, presenting the extracted parts to an operator, and automatically creating the analysis model on the basis of a modification instruction by the operator.

The method of creating an analysis model and the program for creating an analysis model according to the embodiments of the present invention can efficiently issue instructions used for creating the analysis model for a CAD model that is modified.

The method of creating an analysis model and the program for creating an analysis model according to the embodiments of the present invention include means for setting instruction information used for automatically creating the analysis model of each connecting part between parts in the creation of the analysis model of an assembly.

The method of creating an analysis model and the program for creating an analysis model according to the embodiments of the present invention can prevent erroneous setting by the operator and can determine whether the connection type that is set is applicable when the shape of the CAD model is modified to change the shape elements composing the connecting part.

The method of creating an analysis model and the program for creating an analysis model according to the embodiments of the present invention can determine whether the settings of a connecting part, which are set before the shape of the CAD model is modified, are applicable also after the shape of the CAD model is modified.

The method of creating an analysis model and the program for creating an analysis model according to the embodiments of the present invention can easily detect whether a target shape element before the shape of the CAD model is different from that after the shape of the CAD model is modified.

The method of creating an analysis model and the program for creating an analysis model according to the embodiments of the present invention can easily search for shape elements on the modified CAD model, corresponding to the shape elements on the CAD model before the shape thereof is modified.

The method of creating an analysis model and the program for creating an analysis model according to the embodiments of the present invention can extract instruction information applicable to the modified CAD information from the instruction information which is set for the CAD model before the shape thereof is modified and which is used for creating the analysis model.

The method of creating an analysis model and the program for creating an analysis model according to the embodiments of the present invention can extract instruction information applicable to creation of the analysis model for the modified CAD information from the instruction information which is set for the CAD model before the shape thereof is modified and which is used for creating the analysis model.

The method of creating an analysis model and the program for creating an analysis model according to the embodiments of the present invention allows the operator to easily recognize the parts to which the connection type set for the shape element is inapplicable.

According to an embodiment of the present invention, a method of creating an analysis model includes the steps of storing first shape information in association with instruction information that is used for creating the analysis model and that includes shape feature information about a connecting part in the first shape information; comparing second shape information with the first shape information associated with the instruction information; determining whether a difference between the first shape information and the second shape information is within an allowable range for the shape feature information included in the instruction information; and setting the instruction information if the difference between the first shape information and the second shape information is within the allowable range.

According to another embodiment of the present invention, a program for creating an analysis model includes computer-executable instructions for storing first shape information in association with instruction information that is used for creating the analysis model and that includes shape feature information about a connecting part in the first shape information; computer-executable instructions for comparing second shape information with the first shape information associated with the instruction information; computer-executable instructions for determining whether a difference between the first shape information and the second shape information is within an allowable range for the shape feature information included in the instruction information; and computer-executable instructions for setting the instruction information if the difference between the first shape information and the second shape information is within the allowable range.

According to the present invention, it is possible to greatly reduce the time necessary to create an analysis model for a shape model the shape of which is modified.

According to the present invention, it is possible to automatically extract only parts that are required to be reset, to present the extracted parts to an operator, and to automatically create an analysis model on the basis of a modification instruction by the operator.

Specifically, it is possible to greatly reduce the time necessary for the operator to perform the operation, compared with a case in which all the instruction information used for creating an analysis model is set for a CAD model the shape of which is modified from the first.

It is possible to save the trouble of the operator and to automatically detect whether the set information about the connecting part is applicable when the shape model is modified.

It is possible to reduce the time necessary for the operator to perform the confirmation and to prevent generation of the analysis model providing low-precision solutions due to erroneous setting by the operator.

It is possible to automatically determine which shape element is modified and to automatically detect the settings that are applicable also after the CAD model is modified from the settings for the connecting part set before the CAD model is modified. Accordingly, it is possible to save the trouble of the operator.

Since it is possible to detect whether each shape element is changed due to the modification of the shape of the CAD model with a simple process, the configuration of processes can be made simple and the processing time can be reduced.

Since it is possible to easily detect the shape elements before and after the shape of the CAD model is modified, the configuration of processes can be made simple and the processing time can be reduced.

Since the shape elements can be detected even if the corresponding shape information is modified, it is possible to detect the settings of the connecting part, which are applicable even if the shape information is updated after the shape of the CAD model is modified.

It is possible to automatically extract the instruction information applicable to the modified CAD model from the instruction information which is set for the CAD model before the modification and which is used for creating the analysis model, thus saving the trouble of the operator.

It is possible for the operator to easily recognize the parts to which the connection type set for the shape element is inapplicable and to efficiently set the instruction information used for creating the analysis model.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 illustrates the shape element pair of a connecting part.

FIG. 5 illustrates settings of the connection types of connecting parts.

FIG. 6 is a table including settings of connecting parts.

FIG. 14 illustrates the connecting part after the CAD model is modified.

FIG. 15 is a table including shape information about screw holes for which the screw connection is adopted and which are stored before the CAD model is modified.

FIG. 16 is a table including shape information about screw holes for which the screw connection is adopted and which are stored after the CAD model is modified.

DESCRIPTION OF THE EMBODIMENTS

Exemplary embodiments of the present invention will herein be described in detail with reference to the attached drawings.

First Exemplary Embodiment

According to a first exemplary embodiment of the present invention, a process of recreating an analysis model for a CAD model whose shape is modified will now be described. The process uses first CAD shape information (first shape information) and second CAD shape information (second shape information). Instruction information for the creation of the analysis model from the CAD shape information about the CAD model that has been set is used as the first shape information.

Figure 1:
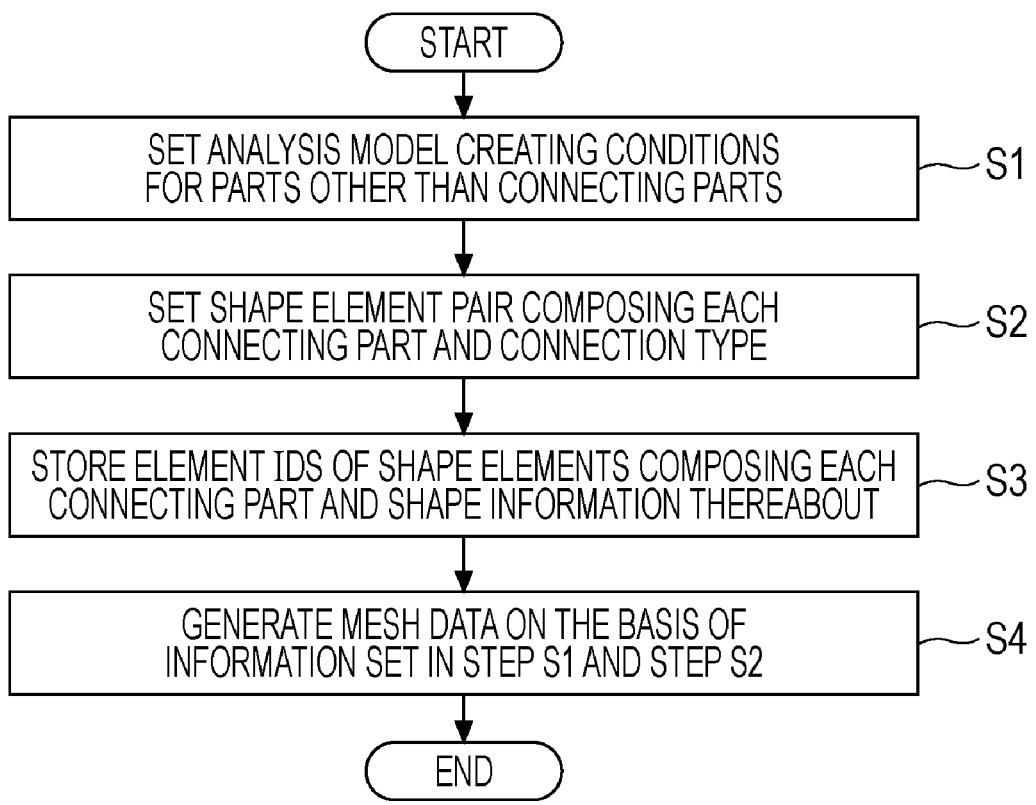
FIG. 1 is a flowchart illustrating an example of a process of generating basic mesh data from CAD information, according to a first exemplary embodiment of the present invention.
Figure 2:
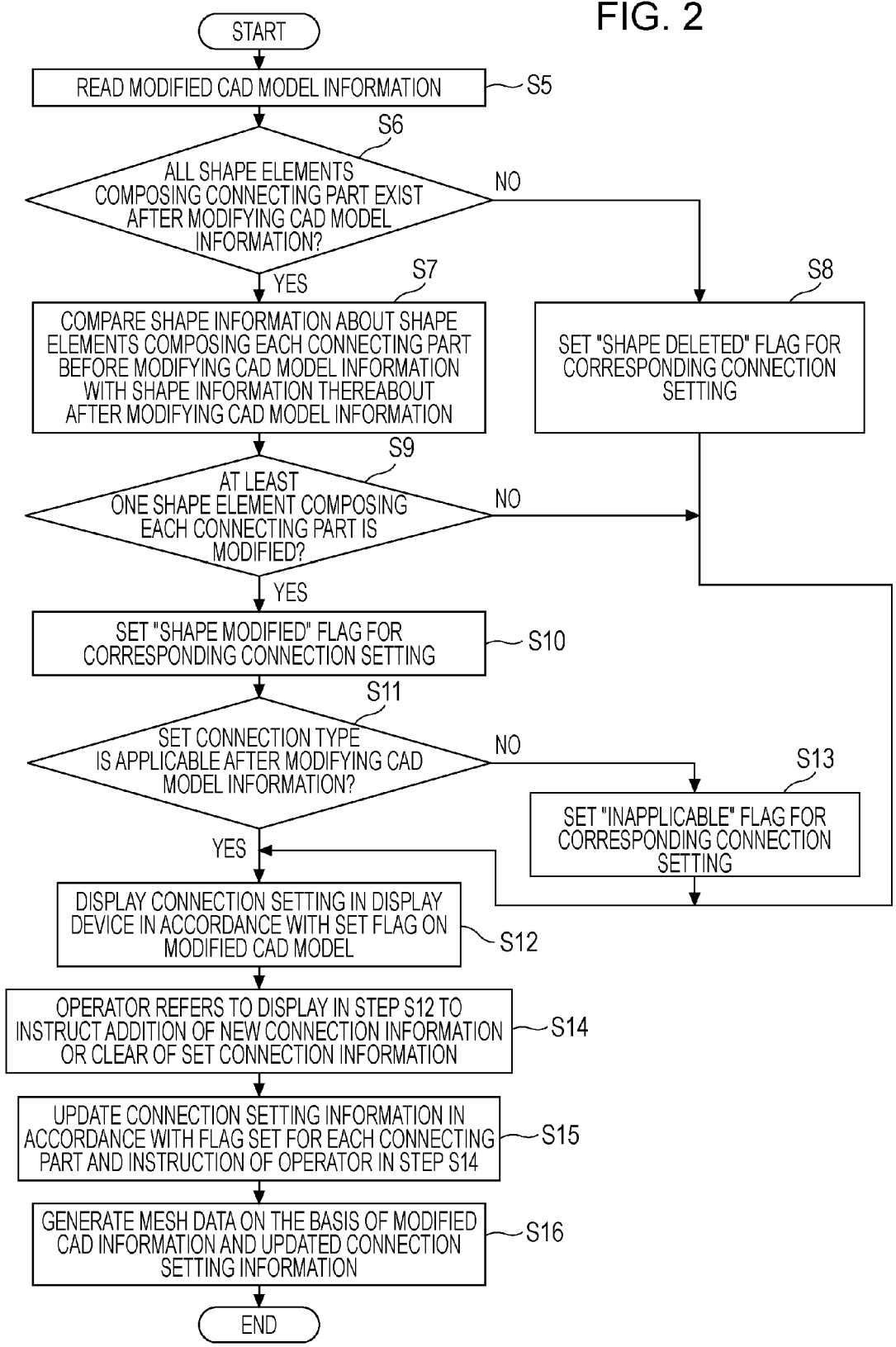
FIG. 2 is a flowchart illustrating an example of a process of regenerating mesh data for CAD information that is modified from the modified CAD information and the basic mesh data, according to the first exemplary embodiment of the present invention.
Figure 3:
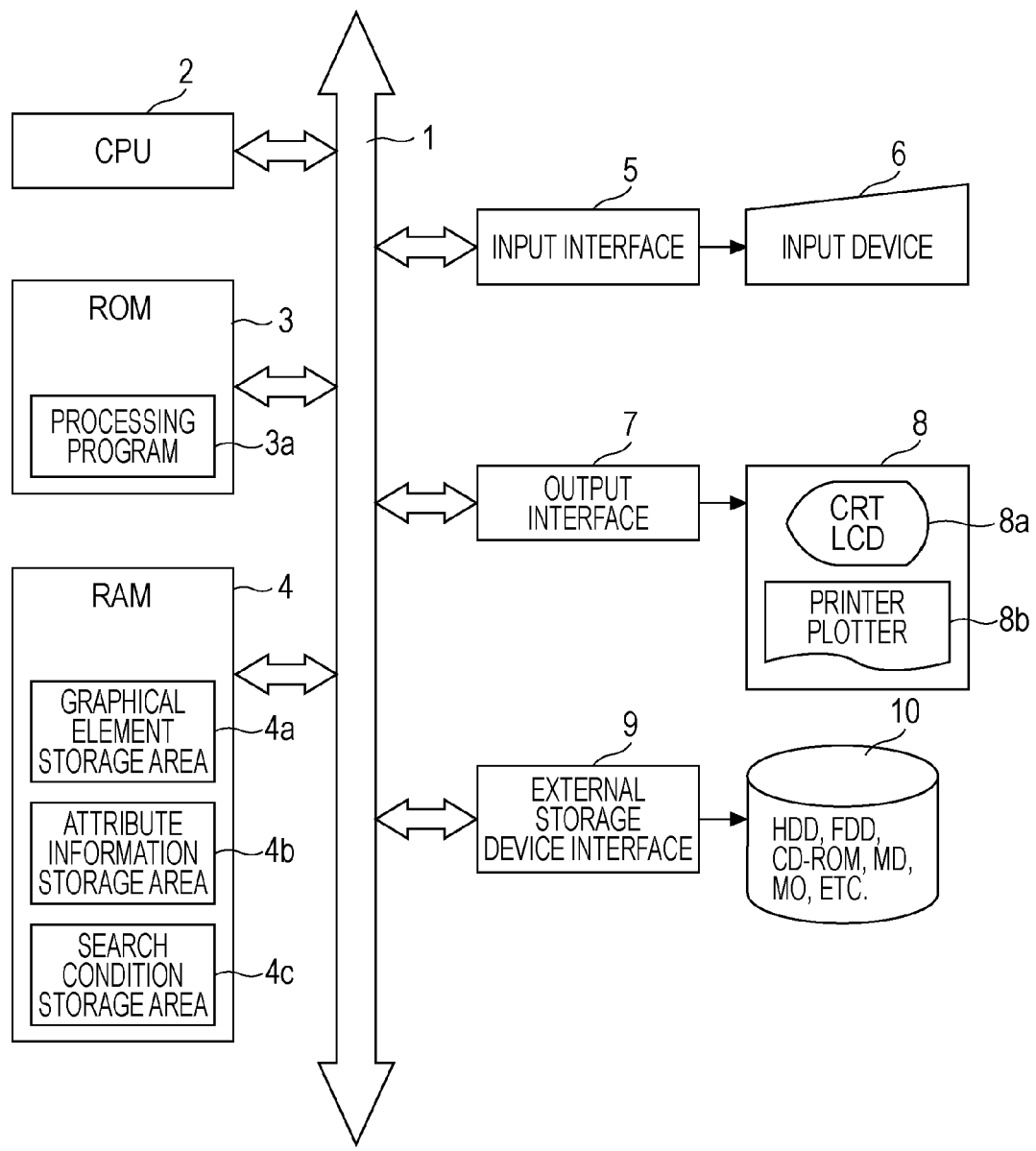
FIG. 3 is a block diagram showing an example of an apparatus according to the first exemplary embodiment of the present invention.

FIGS. 1 and 2 are flowcharts illustrating exemplary processes in a method of creating an analysis model according to the first exemplary embodiment. FIG. 1 is a flowchart illustrating a process of newly creating an analysis model. FIG. 2 is a flowchart illustrating a process of recreating an analysis model corresponding to a shape model that has been modified. FIG. 3 is a block diagram showing a preferred example of the configuration of an information processing apparatus, such as a computer, used to embody the present invention. The information processing apparatus realizes programs described below.

As shown in FIG. 3, the information processing apparatus includes a data bus 1 through which data in the information processing apparatus is transferred and which communicates with other information processing apparatuses connected to a network, a central processing unit (CPU) 2 performing arithmetic processing, and a first storage device (read only memory (ROM)) 3 storing a processing program 3a in which procedures are defined.

The information processing apparatus also includes a second storage device (random access memory (RAM)) 4 including areas where data to be processed is stored (for example, a graphical element storage area 4a, an attribute information storage area 4b, and a search condition storage area 4c), an input device 6 including a keyboard and a mouse, and an input interface 5 with the input device 6.

The information processing apparatus further includes an output device 8 and an output interface 7 with the output device 8. The output device 8 includes a display unit 8a, such as a cathode ray tube (CRT) display or a liquid crystal display, and a drawing unit 8b including a printer and a plotter. The information processing apparatus is provided with a third storage device 10, such as a hard disk device (HDD), a flexible disk device (FDD), a compact disk ROM (CD-ROM), a minidisc (MD), or a magneto-optical (MO) storage device, and an external storage device interface 9. Data to be processed and processed data are stored in the third storage device 10.

The third storage device 10 may be included in the main body of the information processing apparatus or may be connected to an external information processing apparatus via the external storage device interface 9. A required instruction of a user is input with the input device 6, and the processing status and final results are output with the output device 8. Data necessary for the processing is transmitted from the input device 6 or the third storage device 10 in a similar information processing apparatus on the network or in the information processing apparatus to the information processing apparatus through the data bus 1 and the input interface 5 or the external storage device interface 9 and is stored in the second storage device (RAM) 4.

The CPU 2 performs the processing in accordance with the processing program 3a stored in the first storage device (ROM) 3. Data is stored in different devices depending on the stage of the processing. Specifically, data that is temporarily required is stored in the second storage device (RAM) 4, data that is output is stored in, for example, the third storage device 10 as needed, and final outputs are stored in a server (not shown) on the network through the data bus 1.

Processes performed by the information processing apparatus (hereinafter referred to as the apparatus) shown in FIG. 3 will now be described with reference to the flowcharts shown in FIGS. 1 and 2. According to the first exemplary embodiment of the present invention, the analysis model is exemplified by a finite element model (FEM) targeted for structure analysis and vibration analysis.

First, a process of newly creating a basic analysis model will now be described with reference to the flowchart in FIG. 1. Information about a CAD model of an assembly is created with a CAD system and is stored in the second storage device 4 or the third storage device 10 through the data bus 1. The apparatus graphically displays the information about the CAD model of the assembly, stored in the third storage device 10 or the second storage device 4, in the display unit 8a through the external storage device interface 9 and the output interface 7 such that an operator can easily recognizes the information.

Shape information about the CAD model processed by the apparatus includes shape feature information about each part. The shape feature information about each part includes geometric information about planes, edges, and apices, which are shape elements composing the shape of each part, and phase information representing the relationship between adjacent shape elements. Each shape element is managed on the basis of the element ID used for identifying each shape element in the entire CAD shape information. The apparatus extracts the shape information about each shape element on the basis of the specified element ID.

The geometric information about a plane indicates the type of the plane, such as a simple plane, a cylindrical plane, a spherical plane, a conical plane, or a NURBS curved surface, and is provided for every type of the plane. Examples of the geometric information about a plane include the followings for every type of the plane. When the shape element is a simple plane, the geometric information includes the coordinate value of a certain point on the simple plane and each component of the normal vector of the simple plane. When the shape element is a spherical plane, the geometric information includes the coordinate value of the central point of the spherical plane and the radius thereof. When the shape element is a cylindrical plane, the geometric information includes the directional vector of an axis of the cylindrical plane and the coordinate value of a certain point through which the axis run.

The geometric information about an edge indicates the type of the edge, such as a line segment, a circle, an arc, an elliptic arc, or a NURBS curved line, and is provided for every type of the edge. Examples of the geometric information about an edge include the followings for every type of the edge. When the shape element is a line segment, the geometric information includes the coordinate values of the starting point and the end point of the line segment. When the geometric element is a circle, the geometric information includes the coordinate value of the central point of the circle, the radius thereof, and the normal vector of the plane where the circle exists. When the shape element is an arc, the geometric information includes the same information as in the circle, the coordinate values of the starting point and the end point of the arc, and the coordinate value of the central point of the arc.

When the shape element is a plane, boundary information indicating a subregion among all the regions represented by the geometric information about the plane is represented as the phase information. The phase information representing the boundary information is information concerning the edge composing the boundary.

Layout information about each part indicates the relationship between the local coordinate system in which the shape of each part is defined and the global coordinate system. Specifically, in the three dimension, the directions along the X, Y, and Z axes in the local coordinate system can be represented by the component values of directional vectors in the global coordinate system. The FEM, which is the analysis model output from the apparatus, includes mesh data representing each part and mesh data representing connecting parts between the parts. The mesh data includes information about apices called nodes and elements each having the nodes as the apices. The information about each node is represented by the coordinate value of the point and the degree of freedom of the node. In the three dimension, three degrees of freedom for translation and three degrees of freedom for rotation are used for each node. Each node has information indicating whether each degree of freedom is available therefor.

Information about each element is represented by the type of the element and information necessary for the type. Various elements are processed in the apparatus depending on the shape types of the elements. Specifically, when the element represents a plane of an object, triangle and quadrilateral elements are processed. When the element represents a solid, tetrahedral and hexahedral elements are processed. When the element represents a connecting part between parts, line elements such as rigid elements including RBE2 and a multipoint constraint (MPC) are processed. The elements can be grouped into primary elements and secondary elements even when the elements have the same shape type. The primary element differs from the secondary element in the modeling method in the analysis. The shape type and the information indicating the node corresponding to the apex of each element are necessary to determine the type of each element.

The apparatus displays a list of the shapes of parts in the display unit 8a on the basis of the information about the CAD model stored in the second storage device 4 or the third storage device 10. The operator selects a desired shape of each part with the input device 6. The apparatus creates a basic analysis model of the selected type. The apparatus stores analysis model creating conditions, which are input by the operator with the input device 6 as the instruction information used for creating the analysis model of the selected shape of the part, in the second storage device 4 or the third storage device 10 (Step S1 in FIG. 1).

The apparatus automatically generate mesh data on the surface of the object, excluding mesh data about the connecting parts and parts around the connecting parts, on the basis of the input instruction information in Step S4 in FIG. 1. The analysis model creating conditions input by the operator includes the shape types of the elements composing the mesh data representing the surface of the object and the mesh sizes of the elements. The operator instructs the shape type, such as a triangle or a quadrilateral, for each element composing the mesh data representing the surface of the object as the condition of the shape of the element. The operator instructs, for example, the average, maximum, and minimum sizes of each element composing the mesh data as the conditions of the mesh size. According to the present embodiment, the diameter of the circumcircle of a triangle is used as an index representing the size when the shape type of an element is the triangle, and the length of the diagonal of a quadrilateral is used as the index representing the size when the shape type of an element is the quadrilateral.

The shape types of the elements composing the mesh data and the mesh sizes set by the operator affects the analysis accuracy of the created analysis model and the time necessary to perform the analysis of the created analysis model. In general, although the analysis accuracy of quadrilateral elements is higher than that of triangle elements, it takes a longer time to create the mesh of the quadrilateral elements compared with the case where the mesh of the triangle elements is created. In addition, although the analysis accuracy is increased with the decreasing size of the mesh, it takes a longer time to analyze the analysis model as the size of the mesh is decreased. Accordingly, the operator should set the appropriate analysis model creating conditions in consideration of the above characteristics.

Next, the apparatus sets a pair of shape features (shape feature information pair), such as an edge, a plane, and a hole, composing each connecting part and the connection type of the connecting part, which are instructed by the operator with the input device 6, in the CAD model displayed in the display unit 8a. The apparatus stores this information in the second storage device 4 or the third storage device 10 (Step S2 in FIG. 1).

When the shape feature includes a single shape element, such as an edge or a plane, the operator instructs the single shape element as the shape feature of each part. When the shape features include multiple shape elements, as in a hole composed of two arcs, the operator instructs all the shape elements composing the shape features. Alternatively, the operator may instruct one of the shape elements composing the shape features, the apparatus may automatically determine the shape feature(s), such as a hole, necessary for the connection, and the operator may confirm the determined feature or may select a feature from the determined features. Alternatively, the apparatus may automatically detect a pair of adjacent shape features on the basis of the CAD model information stored in the second storage device 4 or the third storage device 10 and may highlight the shape elements having the detected shape features on the CAD model displayed in the display unit 8a, and the operator may select the shape feature information pair composing the connecting part from the highlighted shape elements with the input device 6 to instruct the shape feature information pair.

A case where the shape feature composing the connecting part is composed of only a single shape element is described for simplicity. Accordingly, it is sufficient for the operator to instruct a shape element pair, instead of a shape feature pair, in order to specify a connecting part in the following description.

The specified connection type determines the mesh data generated on the basis of each shape element composing the shape element pair of the instructed connecting part. Since how the mesh data is generated affects the accuracy of the analysis of the assembly, it is necessary to set a connection type appropriate for the connecting method of the assembly on the actual apparatus.

The connection types include connection with a screw (screw connection), welding, and connection with a spring (spring connection), depending on the actual connecting method of the assembly. The screw connection is sometimes further divided into different subtypes depending on any difference in the connection strength, the type of the screw, or the shape of the screw hole. In order to match the analysis result with the actual phenomenon of an assembly, it is necessary to create an appropriate analysis model depending on the connection type. The mesh data configuration providing accurate analysis results is set in advance for the mesh data corresponding to each connection type by comparison between the analysis results and the experimental results. The mesh data configuration is stored in the first storage device 3, the second storage device 4, or the third storage device 10.

The apparatus determines the connection types applicable to the shape element pair specified by the operator and displays the determined connection types in the display unit 8a. The operator selects one connection type from the applicable connection types displayed in the display unit 8a with the input device 6.

The apparatus stores the connection types applicable to each shape element pair in the first storage device 3, the second storage device 4, or the third storage device 10. For example, the connection type of the screw connecting part of a part 41 and a part 42 is to be determined in an example shown in FIG. 4. The apparatus displays the CAD model in the display unit 8a.

The operator instructs a shape element pair of the circle corresponding to a screw hole C43 of the part 41 and the circle corresponding to a screw hole C44 of the part 42 with the input device 6 while referring to the CAD model displayed in the display unit 8a. The shape element pair is on the surface between the part 41 and the part 42. The instruction information is stored in the storage device in association with the shape information.

The apparatus displays the screw connection, the welding, and the spring connection in the display unit 8a as the connection types applicable when the shape element pair is composed of two circles on the basis of the instruction information. The operator selects one connection type from the applicable connection types displayed in the display unit 8a with the input device 6. The apparatus stores the connection type selected by the operator in the second storage device 4 or the third storage device 10 along with the element IDs of the shape elements in the shape element pair.

In the example shown in FIG. 4, when the operator instructs that the shape element pair of the circles corresponding to the screw hole C43 and the screw hole C44 composes the screw connecting part, the apparatus stores the instruction information in the storage device.

The apparatus displays the three connection types including the screw connection, the welding, and the spring connection, among the data stored in the storage device, in the display unit 8a as the connection types applicable to the shape element pair of the two circles, as in an example shown in FIG. 5.

The apparatus stores the information about the connection type, which the operator has selected with the input device 6 while referring to the display in the display unit 8a, in the storage device. In the example shown in FIG. 5, the apparatus first displays the list including the screw connection, the welding, and the spring connection as the connection types applicable to the shape element pair of the two circles.

The apparatus stores the type of the screw connection instructed by the operator with the input device 6 in the storage device. Then, the apparatus adds the element IDs and the connection type of the shape element pair instructed by the operator to a connection setting information table as new connection setting items and stores the connection setting information table in the second storage device 4 or the third storage device 10.

In an example shown in FIG. 6, connection setting items in which the welding is set as the connection type of screw holes C1 and C2 have been stored in the connection setting information table. The apparatus newly adds connection setting items in which the screw connection is set as the connection type of the screw holes C43 and C44 shown in FIG. 4 to the connection setting information table.

Next, the apparatus searches the CAD model information stored in the second storage device 4 or the third storage device 10 for all or part of the element IDs of the shape elements composing each connecting part on the CAD model and the shape information thereabout stored in Step S2. The apparatus stores the search results in the second storage device 4 or the third storage device 10 along with the shape element pair composing each connecting part and the connection type of the connecting part stored in Step S2 (Step S3 in FIG. 1).

According to the present embodiment, part of the geometric information in association with information about including rectangular parallelepipeds is stored as the shape information about each shape element. The including rectangular parallelepiped of each shape element means the minimum rectangular parallelepiped each edge of which is parallel to the coordinate axis and which includes the shape element. A point having the smallest coordinate value is called a lower left point, and a point having the largest coordinate value is called an upper right point. The including rectangular parallelepiped can be represented by using the two coordinate values.

Figure 7:
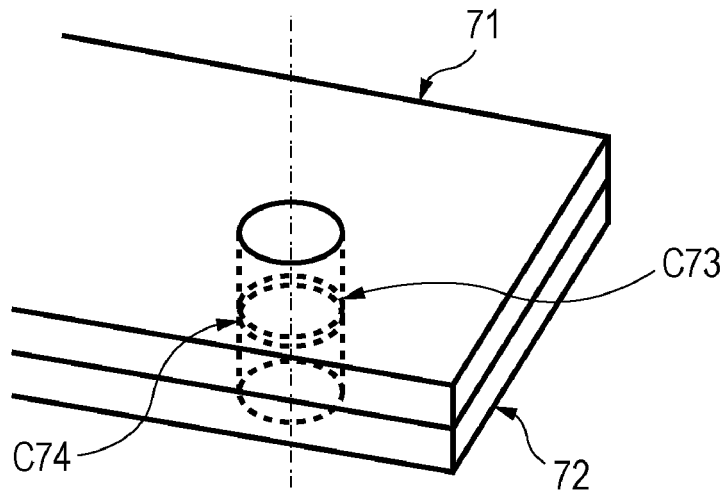
FIG. 7 illustrates a shape element pair from which shape information is extracted.

For example, in an example shown in FIG. 7, a screw hole C73 represented by a circle on a part 71 and a screw hole C74 represented by a circle on a part 72 are specified as the shape element pair composing the connecting part. The apparatus extracts and calculates the central coordinate, the radius, and the normal vector of the screw hole C73, and the coordinate values of the lower left point and the upper right point of an including rectangular parallelepiped B801 of the screw hole C73 from the CAD model information, as illustrated in FIG. 8.

Figure 8:
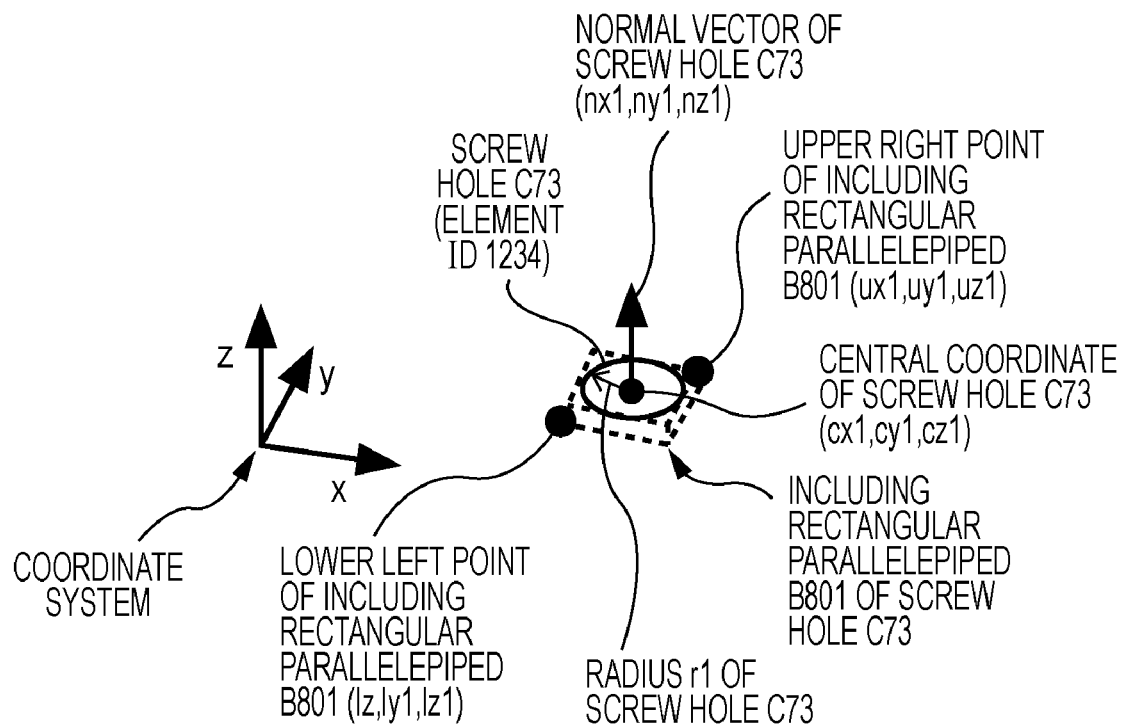
FIG. 8 illustrates shape information extracted when the shape element is a circle.
Figures 9, 10, 11:
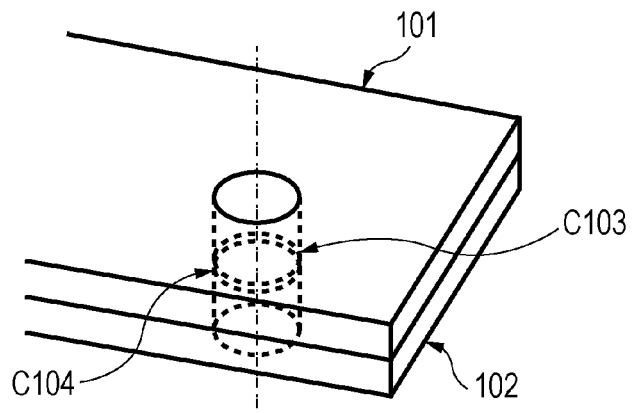
FIG. 9 is a table including the shape information extracted from shape elements.
FIG. 10 illustrates a connecting part for which the mesh data is generated.
FIG. 11 is a table including data set for connecting parts for which the mesh data is generated.

The apparatus stores the values that are extracted and calculated in the manner shown in FIG. 8 for the shape elements composing the connecting part shown in FIG. 7 in the second storage device 4 or the third storage device 10 as table information, as in a table shown in FIG. 9.

Next, the apparatus generates mesh data on the basis of the information set in Steps S1 and S2 (Step S4 in FIG. 1). The apparatus generates the mesh data about the connecting part and around the connecting part on each part on the basis of the shape element pair composing the connecting part and the connection type stored in Step S2.

Specifically, the apparatus refers to the mesh data configuration corresponding to the connection type set for each connecting part to generate the mesh data on the basis of the shape information about the shape elements composing the connecting part.

The mesh data configuration is based on the shape information about the shape elements composing each connecting part and indicates how to create and arrange the nodes and elements in the mesh, which shape, size, and types are set for the elements, and how to set the degree of freedom of each node. The apparatus refers to the information in the mesh data configuration to generate the mesh data corresponding to each connection type.

For example, the circle representing a screw hole C103 on a part 101 and the circle representing a screw hole C104 on a part 102 are set as the shape elements in the shape element pair and the screw connection is set as the connection type in an example shown in FIG. 10. The apparatus adds the connection setting items corresponding to the connecting part shown in FIG. 10 to the connection setting information table as the result of Step S2, as in a table shown in FIG. 11. In the example in FIG. 11, the connection items in which the screw connection is set as the connection type of the screw holes C103 and C104 are added to the connection setting information table including the connection items in which the welding is set as the connection type of the screw holes C1 and C2. The apparatus refers to the mesh data configuration corresponding to the stored connection type to generate the mesh data, as shown in FIG. 12, on the basis of the shape information about the screw holes C103 and C104 stored in Step S3.

Figure 12:
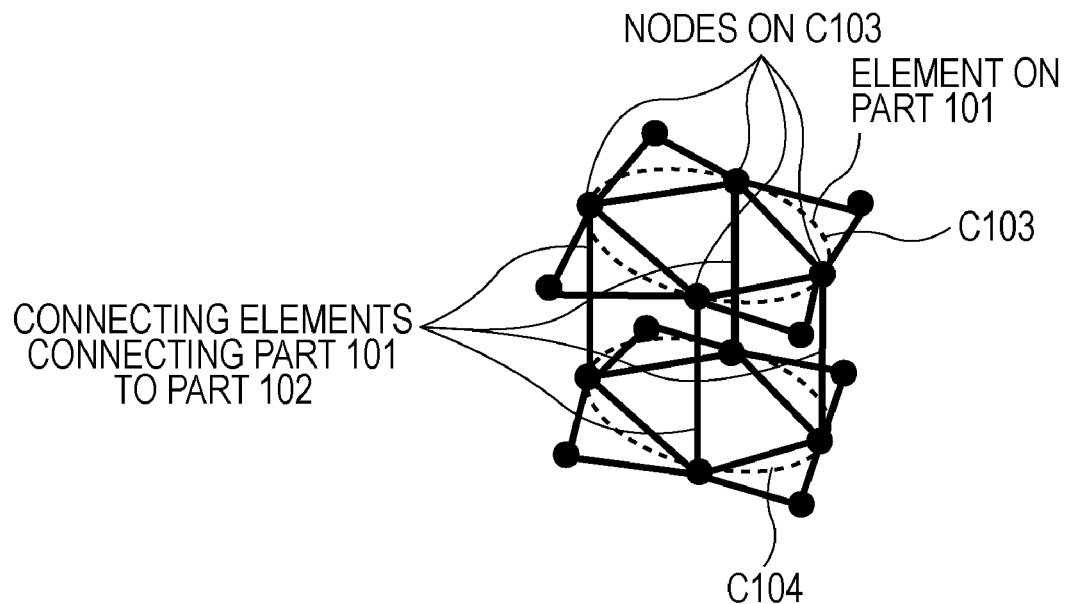
FIG. 12 illustrates mesh data generated for a connecting part.

In the example shown in FIG. 12, the apparatus refers to the geometric information about the circles corresponding to the screw holes C103 and C104 to create four nodes for the respective circles and to arrange the nodes at equal intervals on the perimeters of the circles, which are the shape elements representing the screw holes C103 and C104. Specifically, on the surfaces of the parts 101 and 102, four triangle elements having two nodes on the perimeter of the screw hole C103 are created around the screw hole C103 and four triangle elements having two nodes on the perimeter of the screw hole C104 are created around the screw hole C104. The apparatus automatically determine the size of each triangle on the basis of the distance between the nodes that compose the apices of each triangle and that are arranged on the screw holes C103 or C104 and the criteria for the size of the elements set in the mesh data configuration.

The apparatus creates connecting elements connecting the nodes arranged on the screw hole C103 to the nodes arranged on the screw hole C104 as the elements connecting the part 101 to the part 102. Each connecting element represents constraints between the endpoints of each line element, such as the RBE2 or the MPC. One endpoint of each line element corresponds to a node on the screw hole C103 and the other endpoint of each line element corresponds to a node on the screw hole C104.

The degree of freedom of each node, that is, the allowable range of each node is also set as information in the mesh data configuration for each connection type. The apparatus sets the degree of freedom of each node in accordance with the information in the mesh data configuration.

After generating the mesh data about the connecting part and around the connecting part on each part, the apparatus automatically generates the mesh composed of the triangle and quadrilateral elements in the area on each part where the mesh data is not generated in accordance with the analysis model creating conditions set in Step S1.

The apparatus generates the mesh on each part such that the generated mesh data around the connecting part is matched with the mesh data generated in the remaining areas. The state in which the matching is achieved between the mesh data on the surface of each part, that is, the state in which the mesh data is within the allowable range means that the elements composing the mesh data are not overlapped with each other in the portions other than nodes and that the mesh is generated so as to cover the entire surface of the part. After generating the mesh data on each part, the apparatus generates the mesh inside each part composed of, for example, a rectangular parallelepiped element in accordance with the analysis model creating conditions set in Step S1 on the basis of the mesh data on the surface of each part.

A process of recreating an analysis model when the shape information in the CAD model of an assembly is modified with the apparatus will now be described with reference to the flowchart in FIG. 2. The process in FIG. 2 is performed after the basic analysis model has been created in accordance with the flowchart in FIG. 1.

First, the apparatus reads out CAD model information that has been modified by the operator with, for example, a CAD system. Since the apparatus is connected to the CAD system via the data bus 1, the apparatus reads the modified CAD model information into the second storage device 4 or the third storage device 10 through the data bus 1 (Step S5 in FIG. 2).

Next, the apparatus determines whether all the shape elements composing a target connecting part in the connection settings stored in the storage device exist in the modified CAD model (Step S6 in FIG. 2). The determination is based on the element IDs of the shape elements.

If the apparatus determines in Step S6 that at least one of the shape elements composing the target connecting part does not exist in the modified CAD model, the apparatus sets a "shape deleted" flag for the connection setting defining the target connecting part and stores the "shape deleted" flag in the second storage device 4 or the third storage device 10 (Step S8 in FIG. 2).

If the apparatus determines in Step S6 that all the shape elements composing the target connecting part exist in the modified CAD model, the apparatus compares the shape information about each shape element composing the target connecting part, stored in the second storage device 4 or the third storage device 10 in Step S3, with the shape information about the shape element having the same element ID as that of the stored shape element in the modified CAD model (Step S7 in FIG. 2).

In the comparison of the shape information, the apparatus determines whether the value of each item in the shape information stored in Step S3 coincides with the value of the item for the shape element having the same element ID in the modified CAD model. In the case of single values, the apparatus determines that the values coincide with each other if the difference in the values is within a predetermined threshold value. In the case of coordinate values represented by vectors, the apparatus determines that the values coincide with each other if the calculated distance between the coordinate values is within a predetermined threshold value. In the case of normal vectors indicating the directions of the normal lines of planes or directional vectors indicating the directions of straight lines, the apparatus determines that the values coincide with each other if the angle between the vectors is within a predetermined threshold value.

The threshold values are small values indicating differences in the values concerning the shape and, for example, indicates the difference in length or angle, as described above. The threshold values are set in advance by the operator and are stored in the first storage device 3, the second storage device 4, or the third storage device 10.

Figure 13:
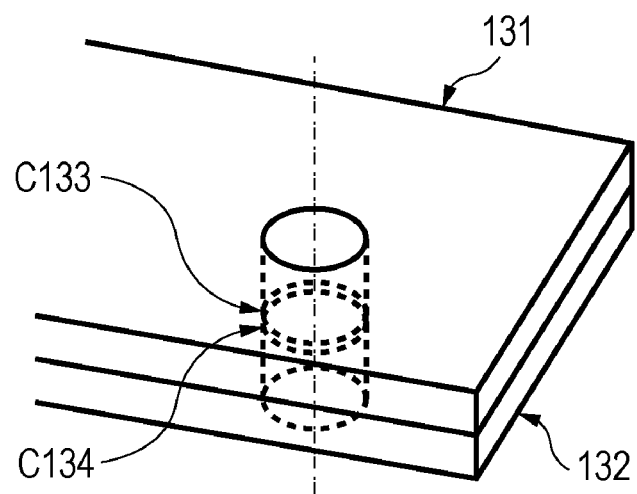
FIG. 13 illustrates a connecting part before the CAD model is modified.

For example, FIG. 13 illustrates the screw connection before the CAD model information is modified. In the example in FIG. 13, a screw hole C133 represented by a circle on a part 131 and a screw hole C134 represented by a circle on a part 132 are shifted to screw holes C143 and C144 in FIG. 14, respectively, by using the editing function of the CAD system. The element IDs of the screw holes C143 and C144 are not changed and are the same as those of the screw holes C133 and C134, respectively. Before the positions of the screw holes are shifted, the screw connection is set as the connection type of the screw holes C133 and C134 in Step S2. As described above in Step S3, the central coordinate, the radius, and the normal vector of each circle, and the coordinate values of the lower left point and the upper right point of the including rectangular parallelepiped of each circle are extracted and calculated and are stored in the second storage device 4 or the third storage device 10.

The apparatus acquires the shape information about the screw holes C133 and C134 on the basis of the element IDs corresponding to the screw holes C133 and C134 from the modified CAD model.

The apparatus compares each item in the shape information about the screw holes C133 and C134 shown in a table in FIG. 15, which is stored before the CAD model is modified, with each item in the shape information about the screw holes C143 and C144 shown in a table in FIG. 16, which is acquired after the CAD model is modified. The comparison allows the apparatus to detect the shape elements of the modified connecting part. The table in FIG. 15 indicates the items corresponding to the element ID, the central coordinate, the radius, the normal vector, the coordinate value of the lower left point of the including rectangular parallelepiped, and the coordinate value of the upper right point of the including rectangular parallelepiped of each of the screw holes C133 and C134 before the CAD model is modified.

The table in FIG. 16 indicates the items corresponding to the element IDs, the central coordinate, the radius, the normal vector, the coordinate value of the lower left point of the including rectangular parallelepiped, and the coordinate value of the upper right point of the including rectangular parallelepiped of each of the screw holes C143 and C144, which are acquired from the CAD model and stored as the table information. After the shape information about the elements having the same element IDs before and after the CAD model is modified is acquired as in FIGS. 15 and 16, the items are compared in the following manner. For example, in order to check the coincidence between signal values, such as the radii of the screw holes C133 and C143, a difference dr in radius is calculated according to Equation (1).

[Formula 1]

$$dr = r1 - r1' \qquad (1)$$

where "r1" denotes the radius of the screw hole C133 and "r1'" denotes the radius of the screw hole C143. It is determined whether the absolute value of the difference dr is within an allowable range of the distance, which is a predetermined threshold value.

In order to check the coincidence between the vector values about the distance, such as the central coordinates, of the screw holes C133 and C143, a vector dC is calculated according to Equation (2).

[Formula 2]

$$dC = (cx1, cy1, cz1) - (cx1', cy1', cz1') \qquad (2)$$

where (cx1, cy1, cz1) denotes the central coordinate of the screw hole C133 and (cx1', cy1', cz1') denotes the central coordinate of the screw hole C143. It is determined whether the size of the vector dC is within an allowable range of the distance.

In order to check the coincidence between the vector values about the angle, as in the normal vectors, it is determined whether the absolute value of the angle between the normal vectors is within an allowable range of the angle, which is a predetermined threshold value.

Next, the apparatus determines whether at least one of the shape elements composing each connecting part is modified on the basis of the result of the comparison between the items in the shape information about all the shape elements composing each connecting part before the CAD model is modified and the items in the shape information about all the shape elements composing the connecting part after the CAD model is modified (Step S9 in FIG. 2).

If the apparatus determines in Step S9 that at least one of the shape elements composing each connecting part is modified, the apparatus sets a "shape modified" flag for the connection setting defining the target connecting part and stores the "shape modified" flag in the second storage device 4 or the third storage device 10 (Step S10 in FIG. 2).

Next, the apparatus refers to the shape information about the shape elements in each shape element pair after the CAD model information is modified to determine whether the connection type set for the target connecting part is applicable also after the CAD model information is modified (Step S11 in FIG. 2). Determination conditions for the applicability of the specified connection type are specified for the shape information about the shape elements in each shape element pair and are stored in the first storage device 3, the second storage device 4, or the third storage device 10. Each of the conditions is represented by an equation or inequality satisfied by the value of a function in which the shape information about each shape element is input.

Figure 17:
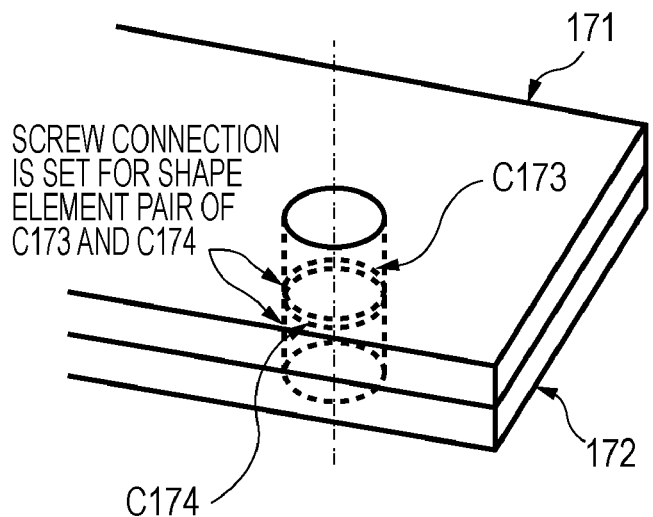
FIG. 17 illustrates a connecting part before the CAD model is modified.

In an example shown in FIG. 17, as in the example in FIG. 13, the screw connection is specified as the connection type for the shape element pair of a screw hole C173 on a part 171 and a screw hole C174 on a part 172. As in the example in FIG. 14, the CAD model information is modified to shift the screw holes C173 and C174 to screw holes C183 and C184 shown in FIG. 18 or to shift the screw holes C173 and C174 to screw holes C193 and C194 shown in FIG. 19. The CAD model information is modified such that the screw holes C173 and C173 have the same movement vector in the example in FIG. 18 whereas the CAD model information is modified such that the screw holes C173 and C174 have different movement vectors in the example in FIG. 19.

The movement vector means the vector between the center of a circle before the movement and the center of a circle after the movement. In the example in FIG. 18, reference letter and numerals V185 denotes the movement vector from the screw hole C173 to the screw hole C183, and reference letter and numerals V186 denotes the movement vector from the screw hole C174 to the screw hole C184. In the example in FIG. 19, reference letter and numerals V195 denotes the movement vector from the screw hole C173 to the screw hole C193, and reference letter and numerals V196 denotes the movement vector from the screw hole C174 to the screw hole C194. The movement vector V185 coincides with the movement vector V186 in the example in FIG. 18 whereas the movement vector V195 does not coincide with the movement vector V196 in the example in FIG. 19. In the example in FIG. 19, the apparatus compares the shape information about the screw hole before the CAD model information is modified with the shape information about the screw hole after the CAD model information is modified to detect whether the shape information is modified, as described above.

Figure 18:
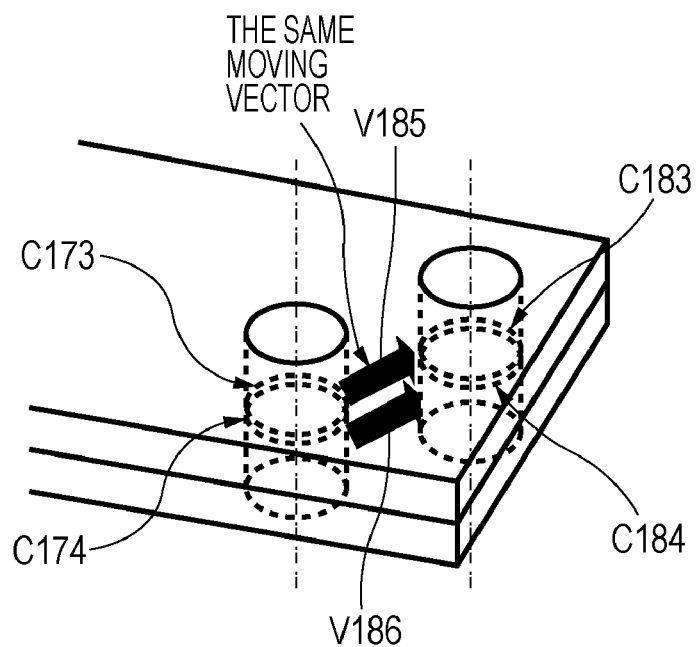
FIG. 18 illustrates an example in which a connection type that is affected by modification of the CAD model and that is set before the CAD model is modified is applicable also after the CAD model is modified.
Figure 19:
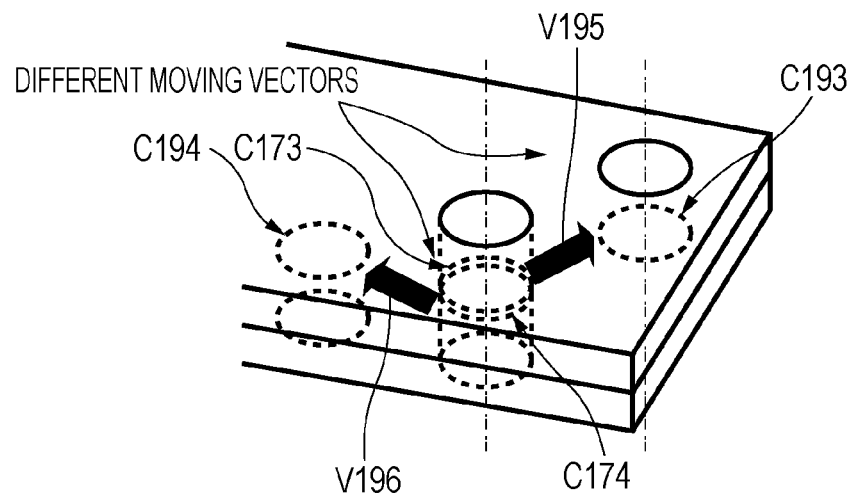
FIG. 19 illustrates an example in which the connection type that is affected by the modification of the CAD model and that is set before the CAD model is modified is inapplicable after the CAD model is modified.
Figure 20:
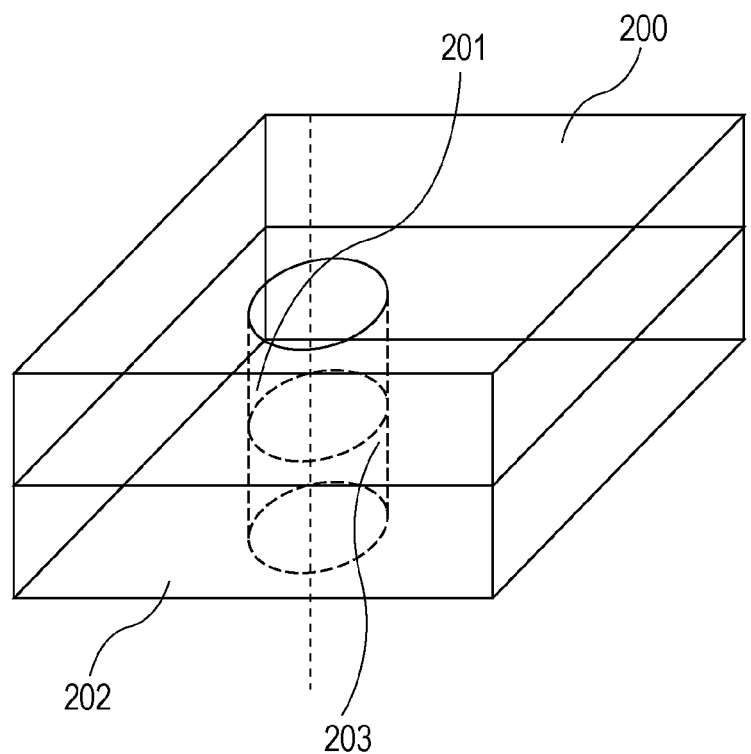
FIG. 20 illustrates connection with a screw.
Figure 21:
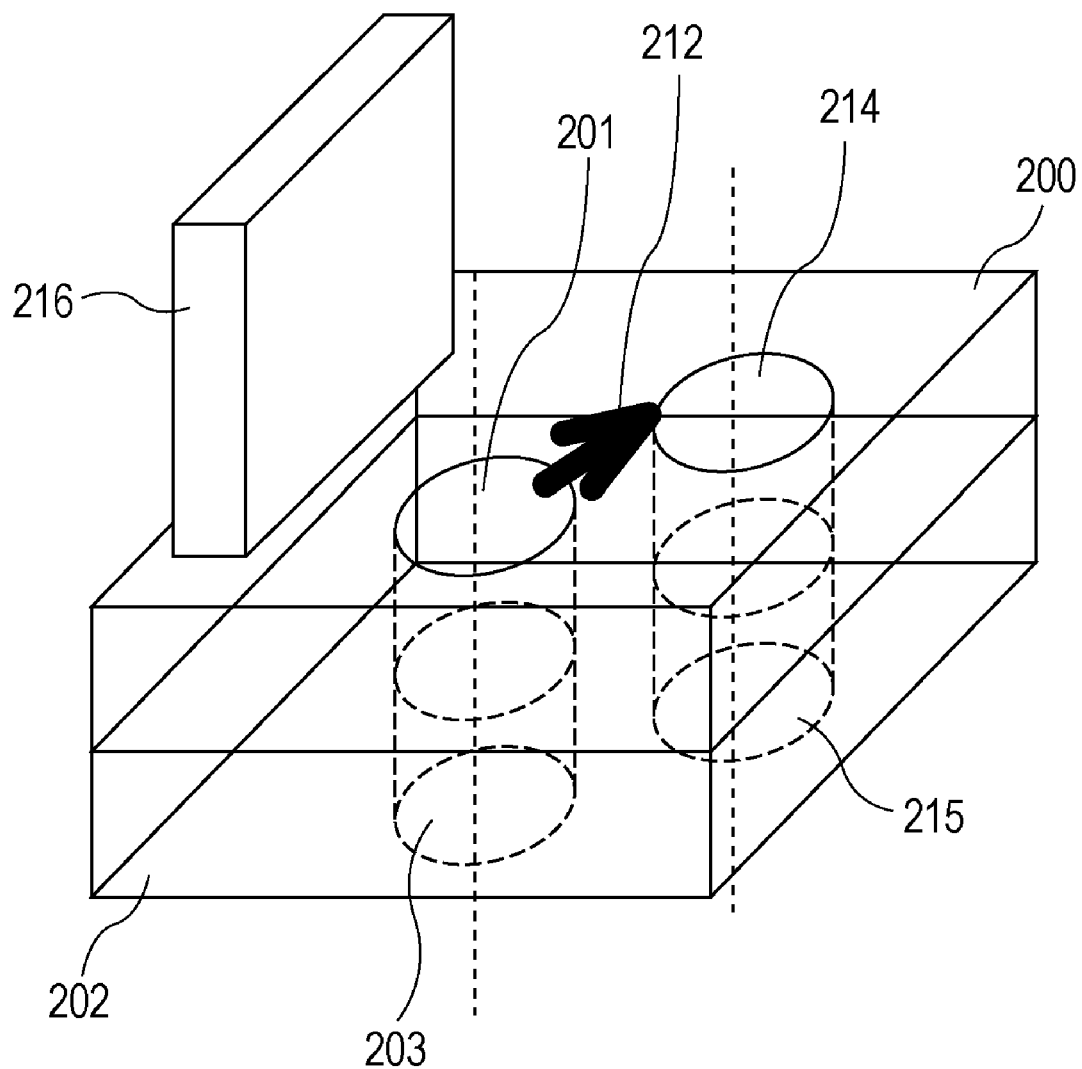
FIG. 21 illustrates a case in which modification of a CAD model affects modeling of a connecting part and a case in which the modification of the CAD model does not affect the modeling of the connecting part.

Since the shape information is modified both in the example in FIG. 18 and in the example in FIG. 19, the apparatus detects that the shape information is modified. After detecting the modification of the shape information, the apparatus determines whether the connection type set in Step S2 is applicable to the shape element pair shown in FIG. 18 or FIG. 19, indicating the shape of the screw hole after the movement.

The set connection type is the screw connection in the example in FIG. 17. The apparatus acquires the determination condition for the availability set for the screw connection from the first storage device 3, the second storage device 4, or the third storage device 10. Then, the apparatus determines whether the shape information about the shape element pair indicating the shape of the screw hole after the movement satisfies the determination condition for the availability.

The determination condition for the availability set for the screw connection is that the distance between the centers of the circles in the circle pair composing the screw hole (the size of the movement vector) and the difference in the radius between the circles in the circle pair composing the screw hole are within threshold values. The apparatus determines whether the shape information about the shape element pair indicating the shape of the screw hole after the movement satisfies the determination condition for the availability. The apparatus determines that the set connection type is applicable also after the CAD model information is modified in the example in FIG. 18 whereas the set connection type is inapplicable after the CAD model information is modified in the example in FIG. 19.

If the apparatus determines in Step S11 that the connection type set in advance is inapplicable after the CAD model information is modified, the apparatus sets an "inapplicable" flag for the connection setting defining the target connecting part and stores the "inapplicable" flag in the second storage device 4 or the third storage device 10 (Step S13 in FIG. 2).

If the apparatus determines in Step S11 that the connection type set in advance is applicable after the CAD model information is modified, the apparatus displays the connection setting in the CAD model in the display unit 8a in a manner such that the operator can easily recognize the connection setting, on the basis of the flag set for the connection setting defining each connecting part (Step S12 in FIG. 2). According to the present embodiment, the apparatus highlights the connection settings for which the "inapplicable" flag is not set in a second color and highlights the connection settings in which at least one shape element is modified and for which the "inapplicable" flag is set in a third color. The connection settings for which the "shape deleted" flag is set are not displayed.

Next, the operator refers to the connection setting displayed in the display unit 8a in Step S12 to instruct addition of the connection setting or clear of the connection setting applicable also after the shape of the CAD model is modified with the input device 6, and the apparatus stores the instruction information in the second storage device 4 or the third storage device 10 (Step S14 in FIG. 2). In the addition of the connection setting, as in Step S2, the operator instructs the shape element pair, such as an edge and a plane, of each part and the connection type on the CAD model displayed in the display unit 8a with the input device 6, and the apparatus stores the instruction information in the second storage device 4 or the third storage device 10. In the clear of the connection setting, the operator instructs any one of the shape elements composing the connecting part that is set in advance with the input device 6.

Next, the apparatus updates the connection setting information (Step S15 in FIG. 2). Specifically, the apparatus adds the connection setting information about the connecting part, the addition of which is instructed by the operator, to the connection setting information that is stored. Or, the apparatus clears the connection setting information about the connecting part, the clear of which is instructed by the operator, and the connection setting information for which the "shape deleted" or "inapplicable" flag is set from the connection setting information stored in the second storage device 4 or the third storage device 10.

The operator may modify the shape of the CAD model again to repeat the steps from Step S5 to S15. Finally, the apparatus generates mesh data on the basis of the CAD model whose shape is modified, the analysis model creating conditions set in Step S1, and the connection setting information updated in Step S15, as in Step S4 (Step S16 in FIG. 2).

As described above, according to the present embodiment, when the shape model of an assembly for which the process of creating an analysis model has been set is modified on the CAD system, it is possible to recreate an analysis model for the modified shape model with a minimal effort.

Second Exemplary Embodiment

According to a second exemplary embodiment of the present invention, shape elements having the same geometric information, instead of shape elements having the same element ID, are detected in order to extract the shape elements composing each connecting part from the CAD model whose shape is modified in Steps S6 and S7 in the first exemplary embodiment of the present invention. For example, when the screw holes C133 and C134 are searched for in the example in FIG. 13, the apparatus searches the CAD information for circles having the same central coordinate, radius, or normal vector.

Accordingly, the determination of whether the connection type set for the shape element pair having the same element ID is applicable also after the CAD information is modified in Step S11 in the first exemplary embodiment is not performed in the second exemplary embodiment. According to the second exemplary embodiment, if the shape elements having the same shape information as the one set for the shape element pair composing each connecting part, set in Step S2, are not detected on the modified CAD model, the apparatus determines that the corresponding connection settings are inapplicable and clears the corresponding connection settings from the connection setting information about the connecting parts. In addition, according to the second exemplary embodiment, the apparatus highlights only the portions to which the connection setting information set in Step S2 is applicable in a first color in Step S12.

According to the second exemplary embodiment of the present invention, it is possible to effectively use the connection information that is set in advance even if the element IDs of the shape elements are not stored in the CAD system when the CAD information is modified.

Third Exemplary Embodiment

According to a third exemplary embodiment of the present invention, an apparatus performs a process of simplifying shapes. The shapes are simplified in order to reduce the analysis time and to simplify the display of complicated shapes by creating a simplified analysis model. Specifically, the shape features about, for example, small ribs or screw holes, are modified to perform the simplification or deletion.

The process of simplifying shapes in the third exemplary embodiment is basically similar to the process according to the first exemplary embodiment. In the process of the third exemplary embodiment, the operator sets conditions for the simplification applied to the specified shape feature with the input device 6 and the apparatus stores the conditions for the simplification in the second storage device 4 or the third storage device 10, instead of Step S1 in the first exemplary embodiment. In addition, the operator simplifies each shape feature, instead of Step S2 in the first exemplary embodiment. Furthermore, the apparatus automatically create a simplification model on the basis of the data set in Steps S and S2. Steps S5 to S15 in the first exemplary embodiment are applicable to each shape feature simplified in the third exemplary embodiment.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-165524 filed Jun. 22, 2007, which is hereby incorporated by reference herein in its entirety.

What is claimed is:

1. A method of creating an analysis model, the method comprising:
    storing first shape information, representing a part, in association with setting information that is used for creating the analysis model of the part and that is set in association with the first shape information;
    comparing second shape information, representing the part with modification, with the first shape information based on the setting information;
    determining, in a case where comparing reveals a difference between the first shape information and the second shape information, whether the difference is within an allowable range; and
    applying the setting information to the part with modification in a case where the difference is within the allowable range.

2. The method of creating an analysis model according to claim 1,
    wherein the setting information includes a connection type applied to shape feature information of a connecting part in the first shape information.

3. The method of creating an analysis model according to claim 2,
    wherein the shape feature information includes geometric information about the connecting part.

4. The method of creating an analysis model according to claim 3, wherein the geometric information in the shape feature information includes information about a graphic including a shape element composing the shape feature information.

5. The method of creating an analysis model according to claim 3,
    wherein the shape feature information includes an element ID of each shape element composing the shape feature information.

6. The method of creating an analysis model according to claim 5,
    wherein the comparing includes:
        searching the second shape information for a shape element having the same element ID as that of the shape element in the shape feature information about the connecting part in the first shape information,
        comparing the geometric information about the shape element in the first shape information with the geometric information about the shape element having the same element ID as in the first shape information in the second shape information, and
        determining whether the difference between the geometric information about the shape element in the first shape information and the geometric information about the shape element in the second shape information is within an allowable range,
    wherein the geometric information about the shape element in the first shape information is the same as the geometric information about the shape element in the second shape information when it is determined that the difference is within the allowable range.

7. The method of creating an analysis model according to claim 6, further comprising, as the result of the comparison:
    highlighting the shape feature information about the connecting part in the second shape information determined to be the same as the first shape information because the difference between the first shape information and the second shape information is within the allowable range by a first method;

highlighting all the shape elements composing the connecting part by a second method in a case where it is determined that the connection type set for the shape feature information in the corresponding first shape information is applicable to the shape feature information in the second shape information determined not to be the same as the first shape information because the difference between the first shape information and the second shape information is not within the allowable range; and highlighting all the shape elements composing the connecting part by a third method if it is determined that the connection type set for the shape feature information in the corresponding first shape information is inapplicable to the shape feature information in the second shape information determined not to be the same as the first shape information because the difference between the first shape information and the second shape information is not within the allowable range.

8. The method of creating an analysis model according to claim 1,
wherein determining whether the difference is within an allowable range or not comprises comparing the difference and a threshold.

9. A non-transitory computer-readable storage medium storing a program for creating an analysis model, the program comprising:
computer-executable instructions for storing first shape information, representing a part, in association with setting information that is used for creating the analysis model of the part and that is set in association with the first shape information;
computer-executable instructions for comparing second shape information, representing the part with modification, with the first shape information based on the setting information;
computer-executable instructions for determining, in a case where comparing reveals a difference between the first shape information and the second shape information, whether the difference is within an allowable range; and
computer-executable instructions for applying the setting information to the part with modification in a case where the difference is within the allowable range.

10. The computer-readable storage medium storing the program for creating an analysis model according to claim 9,
wherein the setting information includes a connection type applied to shape feature information of a connecting part in the first shape information.

11. The computer-readable storage medium storing the program for creating an analysis model according to claim 10, wherein the shape feature information includes geometric information about the connecting part.

12. The computer-readable storage medium storing the program for creating an analysis model according to claim 11, wherein the geometric information in the shape feature information includes information about a graphic including a shape element composing the shape feature information.

13. The computer-readable storage medium storing the program for creating an analysis model according to claim 11, wherein the shape feature information includes an element ID of each shape element composing the shape feature information.

14. The computer-readable storage medium storing the program for creating an analysis model according to claim 13,
wherein the comparing instructions include:
searching the second shape information for a shape element having the same element ID as that of the shape element in the shape feature information about the connecting part in the first shape information,
comparing the geometric information about the shape element in the first shape information with the geometric information about the shape element having the same element ID as in the first shape information in the second shape information, and
determining whether the difference between the geometric information about the shape element in the first shape information and the geometric information about the shape element in the second shape information is within an allowable range,
wherein the geometric information about the shape element in the first shape information is the same as the geometric information about the shape element in the second shape information when it is determined that the difference is within the allowable range.

15. The computer-readable storage medium storing the program for creating an analysis model according to claim 14, further comprising, as the result of the comparison:
computer-executable instructions for highlighting the shape feature information about the connecting part in the second shape information determined to be the same as the first shape information because the difference between the first shape information and the second shape information is within the allowable range by a first method;
computer-executable instructions for highlighting all the shape elements composing the connecting part by a second method in a case where it is determined that the connection type set for the shape feature information in the corresponding first shape information is applicable to the shape feature information in the second shape information determined not to be the same as the first shape information because the difference between the first shape information and the second shape information is not within the allowable range; and
computer-executable instructions for highlighting all the shape elements composing the connecting part by a third method if it is determined that the connection type set for the shape feature information in the corresponding first shape information is inapplicable to the shape feature information in the second shape information determined not to be the same as the first shape information because the difference between the first shape information and the second shape information is not within the allowable range.

* * * * *